(12) United States Patent
Li et al.

(10) Patent No.: US 6,407,013 B1
(45) Date of Patent: Jun. 18, 2002

(54) SOFT PLASMA OXIDIZING PLASMA METHOD FOR FORMING CARBON DOPED SILICON CONTAINING DIELECTRIC LAYER WITH ENHANCED ADHESIVE PROPERTIES

(75) Inventors: Lain-Jong Li, Hualien; Tien-I Bao, Hshin-Chu; Cheng-Chung Lin, Taipei; Syun-Ming Jang, Hsin-Chu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/761,422

(22) Filed: Jan. 16, 2001

(51) Int. Cl.$^7$ .................. H01L 21/31; H01L 21/469
(52) U.S. Cl. .................. 438/788; 438/787; 438/789; 427/589; 427/249.15
(58) Field of Search .................. 438/787, 789, 438/790, 795, 788; 427/585, 589, 249.15

(56) References Cited

U.S. PATENT DOCUMENTS

| | | | |
|---|---|---|---|
| 4,992,306 A | 2/1991 | Hochberg et al. | 427/255.3 |
| 6,054,379 A | 4/2000 | Yau et al. | 438/623 |
| 6,072,227 A | 6/2000 | Yau et al. | 257/642 |
| 6,238,751 B1 * | 5/2001 | Mountsier | 427/574 |

* cited by examiner

*Primary Examiner*—Alexander G. Ghyka
(74) *Attorney, Agent, or Firm*—Tung & Associates

(57) ABSTRACT

Within a method for forming a dielectric layer within a microelectronic fabrication there is first provided a substrate. There is then formed over the substrate a carbon doped silicon containing dielectric layer. There is then treated the carbon doped silicon containing dielectric layer with an oxidizing plasma to form from the carbon doped silicon containing dielectric layer an oxidizing plasma treated carbon doped silicon containing dielectric layer. By treating the carbon doped silicon containing dielectric layer with the oxidizing plasma, particularly under mild conditions, to form therefrom the oxidizing plasma treated carbon doped silicon containing dielectric layer, adhesion of an additional microelectronic layer upon the oxidizing plasma treated carbon doped silicon containing dielectric layer is enhanced in comparison with adhesion of the additional microelectronic layer upon the carbon doped silicon containing dielectric layer, while not compromising dielectric properties of the carbon doped silicon containing dielectric layer.

13 Claims, 2 Drawing Sheets

SOFT PLASMA OXIDIZING PLASMA METHOD FOR FORMING CARBON DOPED SILICON CONTAINING DIELECTRIC LAYER WITH ENHANCED ADHESIVE PROPERTIES

BACKGROUND OF THE INVENTION

1. Field of the Invention

The present invention relates generally to methods for forming carbon doped silicon containing dielectric layers within microelectronic fabrications. More particularly, the present invention relates to methods for forming, with enhanced adhesive properties, carbon doped silicon containing dielectric layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly common in the art of microelectronic fabrication to employ interposed between the patterns of patterned microelectronic conductor layers when fabricating microelectronic fabrications microelectronic dielectric layers formed of comparatively low dielectric constant dielectric materials having dielectric constants in a range of from about 2.0 to about 4.0. For comparison purposes, microelectronic dielectric layers formed within microelectronic fabrications from conventional silicon oxide dielectric materials, silicon nitride dielectric materials and silicon oxynitride dielectric materials typically have comparatively higher dielectric constants in a range of from about 4.0 to about 8.0.

Microelectronic dielectric layers formed of comparatively low dielectric constant dielectric materials are desirable in the art of microelectronic fabrication formed interposed between the patterns of patterned microelectronic conductor layers within microelectronic fabrications insofar as such microelectronic dielectric layers formed of dielectric materials having comparatively low dielectric constants provide microelectronic fabrications which may theoretically operate at higher microelectronic fabrication speeds, with attenuated patterned microelectronic conductor layer parasitic capacitance and attenuated patterned microelectronic conductor layer cross-talk.

Of the comparatively low dielectric constant dielectric materials which may be employed for forming microelectronic dielectric layers within microelectronic fabrications, carbon doped silicon containing dielectric materials, such as carbon doped silicon oxide dielectric materials, carbon doped silicon nitride dielectric materials and carbon doped silicon oxynitride dielectric materials, are presently of interest. Carbon doped silicon containing dielectric materials, such as carbon doped silicon oxide dielectric materials, carbon doped silicon nitride dielectric materials and carbon doped silicon oxynitride dielectric materials, are presently of considerable interest insofar as carbon doped silicon containing dielectric materials may be formed employing chemical vapor deposition (CVD) methods and plasma enhanced chemical vapor deposition (PECVD) methods as are generally otherwise conventional in the art of microelectronic fabrication, but with appropriate modification of source materials and/or deposition parameters such as to provide when forming a microelectronic dielectric layer within a microelectronic fabrication a carbon doped silicon containing dielectric material rather than a conventional silicon containing dielectric material.

While carbon doped silicon containing dielectric materials, and in particular carbon doped silicon oxide dielectric materials, are thus desirable in the art of microelectronic fabrication for forming microelectronic dielectric layers within microelectronic fabrications, carbon doped silicon containing dielectric materials are in turn nonetheless also not entirely without problems in the art of microelectronic fabrication for forming microelectronic dielectric layers within microelectronic fabrication. In that regard, it has been observed in the art of microelectronic fabrication that carbon doped silicon containing dielectric materials when employed for forming microelectronic dielectric layers within microelectronic fabrication often provide inadequate adhesion with respect to additional microelectronic layers formed upon the microelectronic dielectric layers formed of the carbon doped silicon containing dielectric materials.

It is thus desirable in the art of microelectronic fabrication to provide microelectronic dielectric layers formed of carbon doped silicon containing dielectric materials, and in particular of carbon doped silicon oxide dielectric materials, having comparatively low dielectric constants, but also with enhanced adhesion with respect to additional microelectronic layers formed thereupon.

It is towards the foregoing object that the present invention is directed.

Various methods and materials have been disclosed in the art of microelectronic fabrication for forming microelectronic layers, and in particular microelectronic dielectric layers, with desirable properties in the art of microelectronic fabrication.

For example, Hochberg et al., in U.S. Pat. No. 4,992,306, disclose a low pressure chemical vapor deposition (LPCVD) method for forming, at a comparatively low deposition temperature of from about 325 to about 700 degrees centigrade, and with a comparatively high deposition rate, a silicon oxide dielectric layer, a silicon nitride dielectric layer or a silicon oxynitride dielectric layer within a microelectronic fabrication. In order to realize the foregoing result, the low pressure chemical vapor deposition (LPCVD) method employs in conjunction with an oxidant source material a silicon source material comprising a two or greater carbon atom content alkylazidosilane, arylazidosilane or alkylarylazidosilane.

In addition, Yau et al., in U.S. Pat. No. 6,054,379 and U.S. Pat. No. 6,072,227 disclose, in conjunction with a microelectronic structure resulting therefrom, a method for forming, with enhanced barrier properties and with enhanced etch stop properties, a microelectronic dielectric layer formed of a lower dielectric constant dielectric material within a microelectronic fabrication. In order to realize the foregoing result, the method employs when forming the microelectronic dielectric layer a plasma enhanced chemical vapor deposition (PECVD) method employing a silicon source material comprising an organosilane, preferably methylsilane, along with an oxidant source material, preferably nitrous oxide.

Desirable in the art of microelectronic fabrication are additional methods and materials which may be employed for forming within microelectronic fabrications microelectronic dielectric layers formed of carbon doped silicon containing dielectric materials, and in particular of carbon doped silicon oxide dielectric materials, having comparatively low dielectric constants, but also with enhanced adhesion with respect to additional microelectronic layers formed thereupon.

It is towards the foregoing object that the present invention is directed.

SUMMARY OF THE INVENTION

A first object of the present invention is to provide a method for forming a carbon doped silicon containing dielectric layer within a microelectronic fabrication.

A second object of the present invention is to provide a method in accord with the first object of the present invention, wherein the carbon doped silicon containing dielectric layer is formed with a comparatively low dielectric constant while simultaneously having enhanced adhesion with respect to an additional microelectronic layer formed thereupon.

A third object of the present invention is to provide a method in accord with the first object of the present invention and the second object of the present invention, wherein the method is readily commercially implemented.

In accord with the objects of the present invention, there is provided by the present invention a method for forming a microelectronic dielectric layer within a microelectronic fabrication. To practice the method of the present invention, there is first provided a substrate. There is then formed over the substrate a carbon doped silicon containing dielectric layer. There is then treated the carbon doped silicon containing dielectric layer with an oxidizing plasma to form from the carbon doped silicon containing dielectric layer an oxidizing plasma treated carbon doped silicon containing dielectric layer.

Within the present invention, by treating the carbon doped silicon containing dielectric layer with the oxidizing plasma to form therefrom the oxidizing plasma treated carbon doped silicon containing dielectric layer adhesion of an additional microelectronic layer formed upon the oxidizing plasma treated carbon doped silicon containing dielectric layer is enhanced in comparison with adhesion of the additional microelectronic layer in an alternative formed upon the carbon doped silicon containing dielectric layer.

The present invention further provides that the oxidizing plasma which is employed for forming from the carbon doped silicon containing dielectric layer the oxidizing plasma treated carbon doped silicon containing dielectric layer employs at least one of: (1) a substrate temperature of no greater than about 100 degrees centigrade; and (2) an oxidant source gas concentration of no greater than about 20 volume percent.

Under such conditions for the oxidizing plasma, the adhesion of the additional microelectronic layer formed upon the oxidizing plasma treated carbon doped silicon containing dielectric layer is enhanced without compromising a dielectric constant of a carbon doped silicon containing dielectric material from which is formed the carbon doped silicon containing dielectric layer in comparison with a dielectric constant of an oxidizing plasma treated carbon doped silicon containing dielectric material from which is formed the oxidizing plasma treated carbon doped silicon containing dielectric layer.

The present invention provides a method for forming a carbon doped silicon containing dielectric layer within a microelectronic fabrication, wherein the carbon doped silicon containing dielectric layer is formed with a comparatively low dielectric constant, while simultaneously having an enhanced adhesion of an additional microelectronic layer formed thereupon.

The present invention realizes the foregoing object by treating a carbon doped silicon containing dielectric layer, which may comprise a carbon doped silicon oxide dielectric layer, with an oxidizing plasma which employs at least one of: (1) a substrate temperature of no greater than about 100 degrees centigrade; and (2) an oxidant source gas concentration of no greater than about 20 volume percent.

The method of the present invention is readily commercially implemented. The present invention employs methods and materials as are otherwise generally known in the art of microelectronic fabrication, but employed within the context of specific series of process limitations to provide the present invention. Since it is thus a specific series of process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming a carbon doped silicon containing dielectric layer within a microelectronic fabrication, wherein the carbon doped silicon containing dielectric layer is formed with a comparatively low dielectric constant, while simultaneously having enhanced adhesion with respect to an additional microelectronic layer formed thereupon.

The present invention realizes the foregoing object by treating a carbon doped silicon containing dielectric layer, which may comprise a carbon doped silicon oxide dielectric layer, with an oxidizing plasma which employs at least one of: (1) a substrate temperature of no greater than about 100 degrees centigrade; and (2) an oxidant source gas concentration of no greater than about 20 volume percent.

Although the preferred embodiment and examples of the present invention illustrate the present invention most specifically within the context of forming within a microelectronic fabrication a carbon doped silicon oxide dielectric layer in turn having formed thereupon with enhanced adhesion a polish stop layer, the present invention may in general be employed for forming carbon doped silicon containing dielectric layers including but not limited to carbon doped silicon oxide dielectric layers, carbon doped silicon nitride dielectric layers and carbon doped silicon oxynitride dielectric layers, with enhanced adhesion thereupon of microelectronic layers including but not limited to microelectronic conductor layers, microelectronic semiconductor layers and microelectronic dielectric layers (which are preferably not carbon doped), for purposes of providing enhanced interfacial adhesion as well as for other purposes, within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 5, there is shown a series of schematic cross-sectional diagrams illustrating the results of forming within a microelectronic fabrication, and with enhanced adhesion of an additional microelectronic layer formed thereupon, a carbon doped silicon oxide dielectric layer in accord with the present invention.

Figure 1:
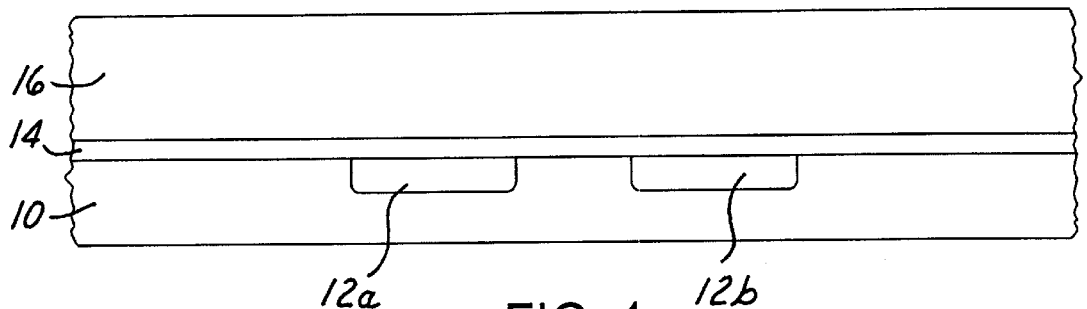
FIG. 1, FIG. 2, FIG. 3, FIG. 4 and FIG. 5 show a series of schematic cross-sectional diagrams illustrating the results of progressive stages of forming within a microelectronic fabrication, and with enhanced adhesion of an additional microelectronic layer formed thereupon, a carbon doped silicon oxide dielectric layer in accord with the present invention.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a pair of contact regions 12a and 12b. In addition, there is also shown within the schematic cross-sectional diagram of FIG. 1 formed upon the substrate 10 including the pair of contact regions 12a and 12b a blanket etch stop layer 14.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

In addition, and although also not specifically illustrated within the schematic cross-sectional diagram of FIG. 1, the substrate 10, typically and preferably, but not exclusively, when the substrate 10 consists of or comprises a semiconductor substrate employed within a semiconductor integrated circuit microelectronic fabrication, has formed therein and/or thereupon microelectronic devices as are similarly also conventional within the microelectronic fabrication within which is employed the substrate 10. Such microelectronic devices may be selected from the group including but not limited to resistors, transistors, diodes and capacitors.

Within the preferred embodiment of the present invention with respect to the pair of contact regions 12a and 12b formed within the substrate 10, the pair of contact regions 12a and 12b formed within the substrate 10 may be formed of contact materials as are conventional in the art of microelectronic fabrication, including but not limited to semiconductor contact materials (particularly under circumstances where the substrate 10 consists of a semiconductor substrate) and conductor contact materials (particularly under circumstances where the substrate 10 consists of a substrate having formed thereover additional layers as are conventional within the microelectronic fabrication within which is employed the substrate 10).

Within the preferred embodiments of the present invention with respect to the blanket etch stop layer 14, the blanket etch stop layer 14 is typically and preferably formed of a conventional silicon containing dielectric material, such as but not limited to a silicon oxide dielectric material, a silicon nitride dielectric material or a silicon oxynitride dielectric material, but without being carbon doped. More typically and preferably, the blanket etch stop layer 14 comprises a silicon nitride dielectric layer deposited employing a plasma enhanced chemical vapor deposition (PECVD) method, although other methods and materials may also be employed for forming the blanket etch stop layer 14. Typically and preferably, the blanket etch stop layer 14 is formed to a thickness of from about 300 to about 1000 angstroms.

Finally, there is also shown within the schematic cross-sectional diagram of FIG. 1 a blanket carbon doped silicon oxide dielectric layer 16 formed upon the blanket etch stop layer 14.

Within the preferred embodiment of the present invention with respect to the blanket carbon doped silicon oxide dielectric layer 16, the blanket carbon doped silicon oxide dielectric layer 16 is formed from a carbon doped silicon oxide dielectric material typically and preferably having a carbon content of at least about 10 atom percent and more typically and preferably having a carbon content of from about 20 to about 40 atomic percent. The carbon doped silicon oxide dielectric material from which is formed the blanket carbon doped silicon oxide dielectric layer 16 may be formed employing methods and materials as are conventional in the art of microelectronic fabrication, and more specifically as are disclosed within the related art references cited within the Description of the Related Art, the disclosures of all of which cited related art references are incorporated herein fully by reference.

More typically and preferably, the carbon doped silicon oxide dielectric material. from which is typically and more preferably formed the blanket carbon doped silicon oxide dielectric layer 16 is formed employing a plasma enhanced chemical vapor deposition (PECVD) method employing an organosilane carbon and silicon source material, more typically and preferably a tetramethylsilane organosilane carbon and silicon source material, along with an oxidant source material, such as but not limited to an oxygen, an ozone, a nitrous oxide or a nitric oxide oxidant source material, and more preferably a nitrous oxide oxidant source material.

When forming the blanket carbon doped silicon oxide dielectric layer 16 of a carbon doped silicon oxide dielectric material in accord with the preferred embodiment of the present invention, the plasma enhanced chemical vapor deposition (PECVD) method also employs: (1) a reactor chamber pressure of from about 2.5 to about 7 torr; (2) a radio frequency source power of from about 100 to about 800 watts per square centimeter of substrate area; (3) a substrate 10 temperature of from about 300 to about 400 degrees centigrade; (4) an organosilane, preferably tetramethylsilane, carbon and silicon source material flow rate of from about 100 to about 800 standard cubic centimeters per minute (sccm); (5) an oxidant source material, preferably nitrous oxide, oxidant source material flow rate of from about 100 to about 500 standard cubic centimeters per minute (sccm); (6) a silane diluent source material flow rate of from about 200 to about 1500 standard cubic centimeters per minute (sccm); and (6) a nitrogen diluent source material flow rate of from about 200 to about 1500 standard cubic centimeters per minute (sccm).

Typically and preferably, the blanket carbon doped silicon oxide dielectric layer 16 is formed to a thickness of from about 2500 to about 8000 angstroms.

Figure 2:
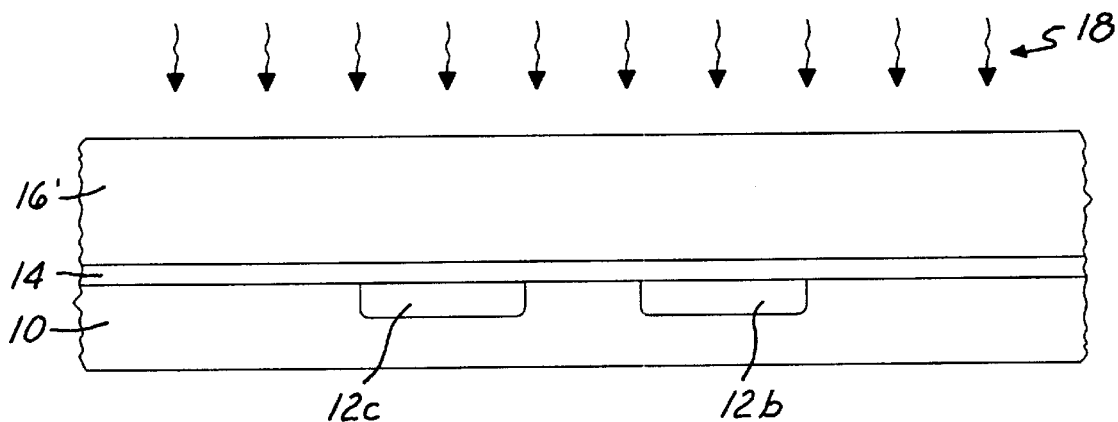

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket carbon doped silicon oxide dielectric layer 16 is treated with an oxidizing plasma 18 to form therefrom an oxidizing plasma treated blanket carbon doped silicon oxide dielectric layer 16'.

Within the preferred embodiment of the present invention, by treating the blanket carbon doped silicon oxide dielectric layer 16 as illustrated within the schematic cross-sectional diagram of FIG. 1 with the oxidizing plasma 18 to form the oxidizing plasma treated carbon doped silicon oxide dielectric layer 16' as illustrated in FIG. 2, there is enhanced adhesion of an additional microelectronic layer formed upon the oxidizing plasma treated carbon doped silicon oxide dielectric layer 16' in comparison with the additional microelectronic layer alternatively formed upon the blanket carbon doped silicon oxide dielectric layer 16.

While adhesion of the additional microelectronic layer formed upon the blanket carbon doped silicon oxide dielectric layer 16 may be enhanced by the oxidizing plasma 18 treatment of the blanket carbon doped silicon oxide dielectric layer 16 to form the oxidizing plasma treated blanket carbon doped silicon oxide dielectric layer 16' within any of several oxidizing plasmas which employ oxidant source gases including but not limited to oxygen, ozone, nitrous oxide and nitric oxide, it is also desirable within the context of the present invention that upon the oxidizing plasma 18 treatment of the blanket carbon doped silicon oxide dielectric layer 16 as illustrated within the schematic cross-sectional diagram of FIG. 1 to form the oxidizing plasma treated blanket carbon doped silicon oxide dielectric layer 16' as illustrated within the schematic cross-sectional diagram of FIG. 2, that a generally lower dielectric constant of a carbon doped silicon oxide dielectric material from which is formed the blanket carbon doped silicon oxide dielectric layer 16 not be appreciably compromised (i.e., not increased by more than about 5 percent). To realize the foregoing object, it has been determined experimentally that comparatively mild conditions employed within the oxidizing plasma 18 will preserve the desirably low dielectric constant dielectric constant properties of the blanket carbon doped silicon oxide dielectric layer 16 when forming therefrom the oxidizing plasma treated blanket carbon doped silicon oxide dielectric layer 16', while simultaneously also providing enhanced adhesion of the additional microelectronic layer formed upon the oxidizing plasma treated blanket carbon doped silicon oxide dielectric layer 16' in comparison with adhesion of the additional layer formed upon the blanket carbon doped silicon oxide dielectric layer 16.

Within the preferred embodiment of the present invention, the comparatively mild conditions employed within the oxidizing plasma 18 include at least one of: (1) a comparatively low substrate 10 temperature (which correlates with a blanket carbon doped silicon oxide dielectric layer 16 temperature) of no greater than about 100 degrees centigrade, more preferably from about 0 to about 50 degrees centigrade, and most preferably from about 10 to about 30 degrees centigrade; and (2) a comparatively low oxidant source gas concentration of no greater than about 20 volume percent, more preferably from about 10 to about 20 volume percent and most preferably from about 15 to about 20 volume percent. There may similarly be employed within an oxidizing plasma 18 in accord with either of the foregoing two options a diluent source gas selected from the group including but not limited to helium, nitrogen and argon.

Within the preferred embodiment of the present invention when employing within the oxidizing plasma 18 the comparatively low substrate temperature, the oxidizing plasma 18 typically and preferably also employs: (1) a reactor chamber pressure of from about 2.5 to about 7 torr; (2) a source radio frequency power of from about 50 to about 300 watts per square centimeter substrate area; (3) an oxidant source gas flow rate of from about 50 to about 200 standard cubic centimeters per minute (sccm); and (4) a diluent source gas flow rate of from about 200 to about 2000 standard cubic centimeters per minute (sccm).

Within the preferred embodiment of the present invention when employing within the oxidizing plasma 18 the comparatively low volume concentration of the oxidant source gas, the oxidizing plasma 18 typically and preferably also employs: (1) a reactor chamber pressure of from about 2.5 to about 7 torr; (2) a source radio frequency power of from about 50 to about 300 watts per square centimeter substrate area; (3) a substrate 10 temperature of from about 300 to about 400 degrees centigrade; (4) an oxidant source gas flow rate of from about 50 to about 200 standard cubic centimeters per minute (sccm); and (5) a diluent source gas flow rate of from about 200 to about 2000 standard cubic centimeters per minute (sccm).

Figure 3:
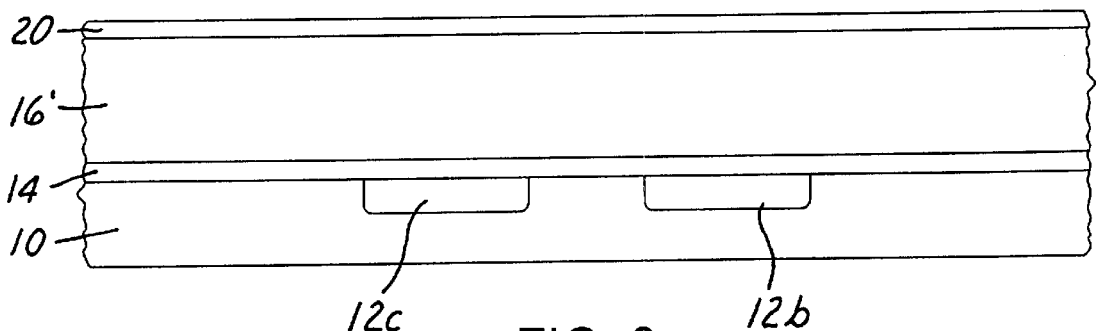

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed upon the oxidizing plasma treated carbon doped silicon oxide dielectric layer 16' a blanket polish stop layer 20.

Within the preferred embodiment of the present invention with respect to the blanket polish stop layer 20 (which may also provide anti-reflective coating (ARC) properties within the microelectronic fabrication whose schematic cross-sectional diagram is illustrated in FIG. 3), the blanket polish stop layer 20 may be formed employing methods and materials as are conventional in the art of microelectronic fabrication, although typically and preferably, the blanket polish stop layer 20 is formed of a silicon oxide polish stop material, (or more preferably) a silicon nitride polish stop material or a silicon oxynitride polish stop material, none of which typically and preferably has a carbon dopant incorporated therein. Typically and preferably, the blanket polish stop layer 20 is formed to a thickness of from about 500 to about 2000 angstroms.

Figure 4:
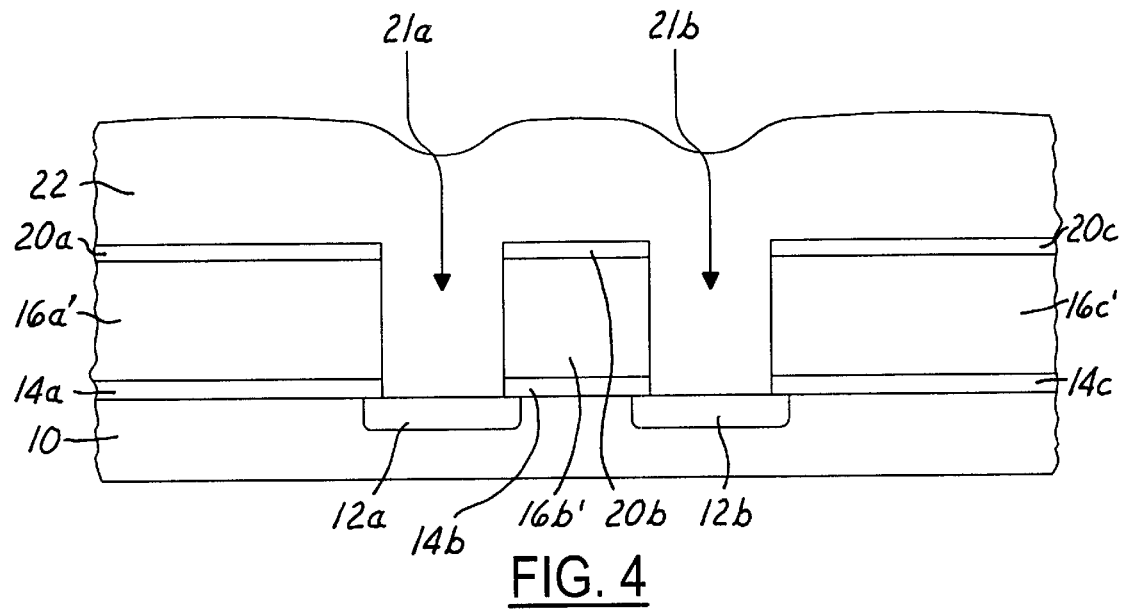

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein, in a first instance, the blanket polish stop layer 20, the oxidizing plasma treated blanket carbon doped silicon oxide dielectric layer 16' and the blanket etch stop layer 14 have been patterned to form a corresponding series of patterned polish stop layers 20a, 20b and 20c, a corresponding series of oxidizing plasma treated patterned carbon doped silicon oxide dielectric layers 16a', 16b' and 16c' and a corresponding series of patterned etch-stop layers 14a, 14b and 14c which in an aggregate define a pair of vias 21a and 21b which access the pair of contact regions 12a and 12b. The pair of vias 21a and 21b each typically and preferably have a linewidth of from about 0.15 to about 0.25 microns and a separation distance of from about 0.15 to about 0.25 microns.

Within the preferred embodiment of the present invention, the blanket polish stop layer 20, the oxidizing plasma treated blanket carbon doped silicon oxide dielectric layer 16' and the blanket etch stop layer 14 may be patterned to form the corresponding series of patterned polish stop layers 20a, 20b and 20c, the corresponding series of oxidizing plasma treated patterned carbon doped silicon oxide dielectric layers 16a', 16b' and 16c' and the corresponding series of patterned etch-stop layers 14a, 14b and 14c, which in the aggregate define the pair of vias 21a and 21b which accesses the pair of contact regions 12a and 12b, while employing etch methods, and in particular plasma etch methods, as are otherwise generally conventional in the art of microelectronic fabrication.

Shown also within the schematic cross-sectional diagram of FIG. 4 formed upon exposed portions of the series of patterned polish stop layers 20a, 20b and 20c, the series of oxidizing plasma treated patterned carbon doped silicon oxide dielectric layers 16a', 16b' and 16c' and the series of patterned etch stop layers 14a, 14b and 14c, while filling the pair of apertures 21a and 21b which accesses the pair of contact regions 12a and 12b, is a blanket conductor layer 22.

Within the preferred embodiment of the present invention with respect to the blanket conductor layer 22, the blanket conductor layer 22 may be formed of conductor materials as are conventional in the art of microelectronic fabrication, including but not limited to metal, metal alloy, doped polysilicon (having a dopant concentration of greater than about 1E18 dopant atoms per cubic centimeter) and polycide (doped polysilicon/metal silicide stack) conductor materials. Typically and preferably, the blanket conductor layer is formed to a thickness of from about 4000 to about 20000 angstroms.

Figure 5:
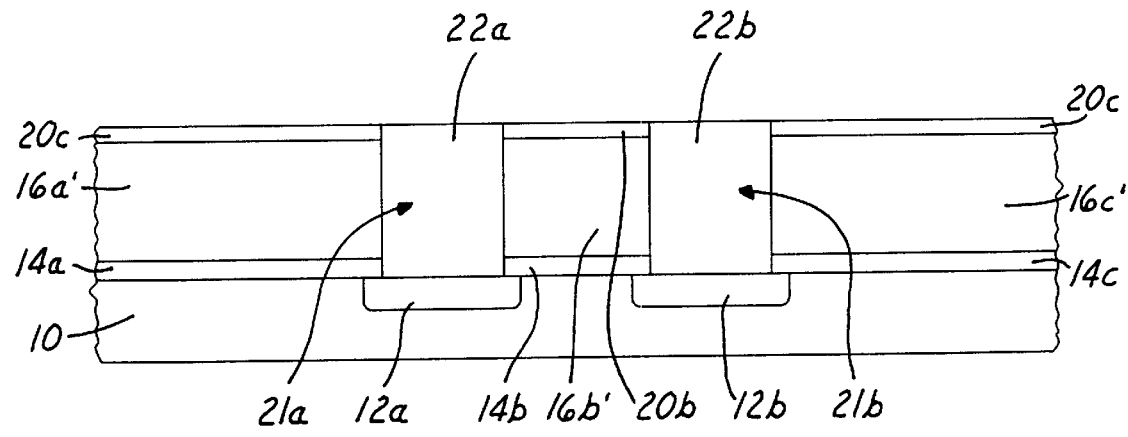

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the blanket conductor layer 22 has been planarized to form a pair of patterned planarized conductor layers 22a and 22b within the pair of apertures 21a and 21b, and contacting the pair of contact regions 12a and 12b, while employing a planarizing method, and in particular a chemical mechanical polish (CMP) planarizing method, which employs the series of patterned polish stop layers 20a, 20b and 20c as a series of chemical mechanical polish (CMP) planarizing polish stop layers. Within the preferred embodiment of the present invention, the chemical mechanical polish (CMP) planarizing method employed for forming from the blanket conductor layer 22 as illustrated within the schematic cross-sectional diagram of FIG. 4 the patterned conductor layers 22a and 22b as illustrated within the schematic cross-sectional diagram of FIG. 5 is otherwise generally conventional in the art of microelectronic fabrication.

Upon forming the microelectronic fabrication whose schematic cross-sectional diagram is illustrated in FIG. 5, there is formed a microelectronic fabrication having formed therein the series of oxidizing plasma treated patterned carbon doped silicon oxide dielectric layers 16a', 16b' and 16c' upon which there is formed with enhanced adhesion the series of patterned polish stop layers 20a, 20b and 20c, even under circumstances where the patterned polish stop layers 20a, 20b and 20c are employed as a series of chemical mechanical polish (CMP) planarizing polish stop layers within a chemical mechanical polish (CMP) planarizing method employed for forming the pair of chemical mechanical polish (CMP) planarized patterned conductor layers 22a and 22b within the pair of apertures 21a and 21b within microelectronic fabrication.

The present invention realizes the foregoing object by plasma treating the blanket carbon doped silicon oxide dielectric layer 16 to form therefrom the oxidizing plasma treated carbon doped silicon oxide dielectric layer 16' prior to forming thereupon the blanket polish stop layer 20, with enhanced adhesion.

Further in accord with the present invention, the oxidizing plasma treated patterned carbon doped silicon oxide dielectric layers 16a', 16b' and 16c' are formed while preserving a desirably low and comparatively low dielectric constant of the carbon doped silicon containing dielectric material from which is formed the blanket carbon doped silicon oxide dielectric layer 16. The present invention realizes the foregoing object by employing within the oxidizing plasma 18 which is employed for treating the blanket carbon doped silicon containing oxide layer 16 to form the oxidizing plasma treated blanket carbon doped silicon containing dielectric layer 16' from which is formed the oxidizing plasma treated patterned carbon doped silicon containing dielectric layers 16a', 16b' and 16c' a comparatively mild oxidizing plasma 18 employing at least one of: (1) a comparatively low substrate temperature of no greater than about 100 degrees centigrade; and (2) a comparatively low oxidant source gas concentration of no greater than about 20 volume percent.

EXAMPLES

There was prepared a series of microelectronic fabrications generally analogous or equivalent to the microelectronic fabrication whose schematic cross-sectional diagram is illustrated in FIG. 3.

The series of microelectronic fabrications employed a series of semiconductor substrates over which were formed a series of blanket silicon nitride etch stop layers formed of thicknesses about 600 angstroms each. The series of blanket silicon nitride etch stop layers was formed employing an otherwise conventional plasma enhanced chemical vapor deposition (PECVD) method employing silane as a silicon source material and ammonia as a nitrogen source material, without carbon doping.

Formed then upon the series of blanket silicon nitride etch stop layers was a series of blanket carbon doped silicon oxide dielectric layers formed employing a plasma enhanced chemical vapor deposition method. The plasma enhanced chemical vapor deposition (PECVD) method also employed: (1) a reactor chamber pressure of about 4 torr; (2) a source radio frequency power of about 600 watts per square centimeter substrate area; (3) a tetramethylsilane carbon and silicon source material flow rate of about 600 standard cubic centimeters per minute; (4) an oxygen oxidant source material flow rate of about 100 standard cubic centimeters per minute (sccm); (5) a helium diluent source material flow rate of about 200 standard cubic centimeters per minute (sccm); and (6) a nitrogen diluent source material flow rate of about 200 standard cubic centimeters per minute (sccm). The series of blanket carbon doped silicon oxide dielectric layers was formed to a thickness of about 5000 angstroms each.

Various of the series of the blanket carbon doped silicon oxide dielectric layers were then exposed to various plasma treatments which included: (1) a low temperature nitrous oxide and helium plasma treatment at a temperature of about 30 degrees centigrade for a time period of either one minute or two minutes, while also employing a reactor chamber pressure of about 4 torr, a source radio frequency plasma power of about 300 watts per square centimeter substrate area, a nitrous oxide flow rate of about 200 standard cubic centimeters per minute (sccm) and a helium flow rate of about 500 standard cubic centimeters per minute (sccm); (2) a high temperature nitrous oxide plasma treatment at a temperature of about 400 degrees centigrade for a time period of about one minute, while also employing a reactor chamber pressure of about 4 torr, a source radio frequency power of about 100 watts per square centimeter substrate area and a nitrous oxide flow rate of about 200 standard cubic centimeters per minute (sccm); (3) a high temperature helium plasma treatment at a temperature of about 400 degrees centigrade for a time period of about one minute, while also employing a reactor chamber pressure of about 4 torr, a source radio frequency power of about 300 watts per square centimeter substrate area and a helium flow rate of about 500 standard cubic centimeters per minute; (4) a high. temperature 20 percent oxygen in helium plasma treatment at a temperature of about 400 degrees centigrade for a time period of about 30 seconds, while also employing a reactor chamber pressure of about 4 torr, a source radio frequency power of about 300 watts per square centimeter substrate area, an oxygen flow rate of about 50 standard cubic centimeters per minute (sccm) and a helium flow rate of about 500 standard cubic centimeters per minute (sccm); (5) a low temperature pure oxygen plasma treatment at a temperature of 30 degrees centigrade for a time period of about 30 seconds, which also employed a reactor chamber pressure of about 4 torr, a source radio frequency power of about 100 watts per square centimeter substrate area and an oxygen flow rate of about 50 standard cubic centimeters per minute (sccm); and (6) a high temperature pure oxygen plasma treatment at a temperature of 400 degrees centigrade for a time period of about one minute, which also employed a reactor chamber pressure of about 4 torr, a source radio frequency power of about 100 watts per square centimeter substrate area and an oxygen flow rate of about 50 standard cubic centimeters per minute (sccm).

There was then formed upon the series of plasma treated carbon doped silicon oxide dielectric layers a series of blanket silicon nitride polish stop layers of thickness about 600 angstroms each, analogous with the series of blanket silicon nitride etch stop layers formed therebeneath, in accord with the microelectronic fabrication whose schematic cross-sectional diagram is illustrated in FIG. 3, and also without carbon doping. The blanket silicon nitride polish stop layers, the oxidizing plasma treated carbon doped silicon oxide dielectric layers and the blanket silicon nitride etch stop layers were then patterned in accord with the schematic cross-sectional diagram of FIG. 4 to provide a series of apertures into which were in part formed a series of blanket copper containing conductor layers also generally in accord with the schematic cross-sectional diagram of FIG. 4. The blanket copper containing conductor layers were then chemical mechanical polish (CMP) planarized to form within the series of apertures a series of chemical mechanical polish (CMP) planarized patterned copper containing conductor layers as generally illustrated within the schematic cross-sectional diagram of FIG. 5, while employing a series of patterned silicon nitride polish stop layers derived from the series of blanket silicon nitride polish stop layers as a series of chemical mechanical polish (CMP) planarizing polish stop layers.

There was then measured by optical inspection for each of the series of microelectronic fabrications an areal percent delamination of the patterned silicon nitride polish stop layers from the oxidizing plasma treated patterned carbon doped silicon oxide dielectric layers, as well as a dielectric constant for each of the oxidizing plasma treated carbon doped silicon oxide dielectric layers. Equivalent measurements were also obtained for a carbon doped silicon oxide dielectric layer deposited absent plasma post treatment. Results of the measurements are reported in Table I

TABLE I

| Plasma Treatment | Dielectric Const | Percent Delam |
|---|---|---|
| N20/He; 30 C; 1 min | 2.87 | 0 |
| N20/He; 30 C; 2 min | 3.10 | 30 |
| N20; 400 C; 1 min | 2.89 | 0 |
| He; 400; 1 min | 3.15 | 10 |
| 20% O2/He; 400 C; 30 sec | 2.85 | 0 |
| 100% O2; 30 C; 30 sec | 2.85 | 0 |
| 100% O2; 400 C; 1 min | 3.30 | 20 |
| no plasma treatment | 2.80 | 100 |

As is seen from review of the data in Table I, there is observed: (1) substantial delamination of the patterned silicon nitride polish stop layers from the oxidizing plasma treated patterned carbon doped silicon oxide layers; and/or (2) dielectric constant increases, under conditions generally not in accord with the present invention, whereas both such delamination and dielectric constant increases are generally avoided with respect to plasma treated carbon doped silicon oxide dielectric layers formed in accord with the present invention.

As is also illustrated from review of the data in Table I, and as an additional limitation within the oxidizing plasma treatment of the present invention, it is typically desirable to limit the oxidizing plasma treatment of the present invention to no greater than about one minute when forming from a carbon doped silicon containing dielectric layer in accord with the present invention an oxidizing plasma treated carbon doped silicon containing dielectric layer in accord with the present invention.

As is understood by a person skilled in the art, the preferred embodiment and examples of the present invention are illustrative of the present invention rather than limiting of the present invention. Revisions and modifications may be made to methods, materials, structures and dimensions through which is fabricated a microelectronic fabrication in accord with the preferred embodiment and examples of the present invention, while still fabricating a microelectronic fabrication in accord with the present invention, further in accord with the accompanying claims.

What is claimed is:

1. A method for forming a dielectric layer comprising:

providing a substrate;

forming over the substrate a carbon doped silicon contusing dielectric layer;

treating the carbon doped silicon containing dielectric layer with an oxidizing plasma to form from the carbon doped silicon containing dielectric layer an oxidizing plasma treated carbon doped silicon containing dielectric layer, wherein there is not appreciably changed a dielectric constant of an oxidizing plasma treated carbon doped silicon containing dielectric material from which is formed the oxidizing plasma treated carbon doped silicon containing dielectric layer in comparison with a dielectric constant of a carbon doped silicon containing dielectric material from which is formed the carbon doped silicon containing dielectric layer.

2. The method of claim 1 further comprising:

forming upon the oxidizing plasma treated carbon doped silicon oxide dielectric layer an additional microelectronic layer, wherein:

by treating the carbon doped silicon containing dielectric layer with the oxidizing plasma to form therefrom the oxidizing plasma treated carbon doped silicon containing dielectric layer adhesion of the additional microelectronic layer upon the oxidizing plasma treated carbon doped silicon containing dielectric layer is enhanced in comparison with adhesion of the additional microelectronic layer upon the carbon doped silicon containing dielectric layer.

3. The method of claim 2 wherein the oxidizing plasma employs at least one of:

a substrate temperature of no greater than about 100 degrees centigrade; and an oxidant source gas concentration of no greater than about 20 volume percent.

4. The method of claim 3 wherein the oxidizing plasma also employs a diluent source gas selected from the group consisting of helium, nitrogen and argon.

5. The method of claim 1 wherein the dielectric layer is employed within a microelectronic fabrication selected from the group consisting of integrated circuit microelectronic fabrications, ceramic substrate microelectronic fabrications, solar cell optoelectronic microelectronic fabrications, sensor image array optoelectronic fabrications and display image array optoelectronic microelectronic fabrications.

6. The method of claim 2 wherein the additional microelectronic layer is formed from a microelectronic material selected from the group consisting of microelectronic conductor materials, microelectronic semiconductor materials and microelectronic dielectric materials.

7. The method of claim 6 wherein the additional microelectronic layer is not carbon doped.

8. The method of claim 2 wherein the additional microelectronic layer is a silicon nitride layer.

9. The method of claim 8 wherein the silicon nitride layer is not carbon doped.

10. The method of claim 1 wherein the carbon doped silicon containing dielectric layer is selected from the group consisting of carbon doped silicon oxide dielectric layers, carbon doped silicon nitride dielectric layers and carbon doped silicon oxynitride dielectric layers.

11. The method of claim 1 wherein the carbon doped silicon containing dielectric layer is, a carbon doped silicon oxide dielectric layer.

12. The method of claim 1 wherein:

the carbon doped silicon containing dielectric layer is formed employing a deposition method selected from the group consisting of chemical vapor deposition (CVD) methods and plasma enhanced chemical vapor deposition (PECVD) methods; and the deposition method employs an organosilane carbon and silicon source material.

13. The method of claim 1 wherein the carbon doped silicon containing dielectric layer is formed with a carbon content of at least about 10 atomic percent.

* * * * *